United States Patent
Crain et al.

(10) Patent No.: US 7,459,916 B2
(45) Date of Patent: Dec. 2, 2008

(54) ELECTROMAGNETIC SHIELDING DEFECT MONITORING SYSTEM AND METHOD FOR USING THE SAME

(75) Inventors: Charles R. Crain, Colorado Springs, CO (US); Phillip D. Lane, Colorado Springs, CO (US); Kelly L. Rice, Colorado Springs, CO (US); James A. Youngman, Woodland Park, CO (US)

(73) Assignee: L-3 Communications Corporation, New York, NY (US)

( * ) Notice: Subject to any disclaimer, the term of this patent is extended or adjusted under 35 U.S.C. 154(b) by 212 days.

(21) Appl. No.: 11/468,755

(22) Filed: Aug. 30, 2006

(65) Prior Publication Data

US 2008/0074123 A1   Mar. 27, 2008

(51) Int. Cl.
 *G01R 27/28* (2006.01)
 *G01N 27/82* (2006.01)

(52) U.S. Cl. .................................. 324/627; 324/240

(58) Field of Classification Search ................ 324/627, 324/612, 600, 557, 718, 456, 216, 237, 238, 324/240, 217
See application file for complete search history.

(56) References Cited

U.S. PATENT DOCUMENTS

| | | | |
|---|---|---|---|
| 3,492,568 A | 1/1970 | Johnson | |
| 3,599,095 A | 8/1971 | Johnson | |
| 3,952,245 A | 4/1976 | Miller | |
| 3,995,213 A | 11/1976 | Robinson et al. | |
| 4,072,899 A | 2/1978 | Shimp | |
| 4,962,358 A | 10/1990 | Svetanoff | |
| 5,068,616 A | 11/1991 | Broyde et al. | |
| 5,153,524 A | 10/1992 | McCormack | |
| 5,477,157 A | 12/1995 | Lee | |
| 5,532,591 A * | 7/1996 | Logue | 324/242 |
| 5,767,789 A | 6/1998 | Afzali-Ardakani et al. | |
| 5,828,220 A | 10/1998 | Carney et al. | |
| 5,939,982 A | 8/1999 | Gagnon et al. | |
| 5,990,689 A | 11/1999 | Poncon | |
| 6,114,849 A * | 9/2000 | Price et al. | 324/240 |
| 6,414,483 B1 * | 7/2002 | Nath et al. | 324/232 |
| 7,295,003 B2 * | 11/2007 | Uyehara et al. | 324/219 |
| 2003/0193331 A1 * | 10/2003 | Nath et al. | 324/240 |

\* cited by examiner

*Primary Examiner*—Vincent Q. Nguyen
*Assistant Examiner*—Hoai-An D Nguyen
(74) *Attorney, Agent, or Firm*—Fitch, Even, Tabin & Flannery

(57) ABSTRACT

An embodiment disclosed herein is directed to an electromagnetic shielding defect monitoring system that includes a transmit system adapted to transmit a first electromagnetic field toward a first surface of an electromagnetically shielded enclosure, thereby generating a first current on the first surface, a stationary receive system adapted to detect a second electromagnetic field transmitted from a second surface of the electromagnetically shielded enclosure by a second current induced on the second surface by the first current and to generate a corresponding detected signal; control circuitry adapted to control operations of the transmit and receive systems; and analysis circuitry adapted to identify a location of a defect in the electromagnetically shielded enclosure based upon operations of the transmit and receive systems and based upon the detected signal.

19 Claims, 6 Drawing Sheets

1

ELECTROMAGNETIC SHIELDING DEFECT MONITORING SYSTEM AND METHOD FOR USING THE SAME

BACKGROUND

1. Field of Invention

Embodiments exemplarily disclosed herein relate to systems and methods for locating faults in electromagnetic shielding.

2. Discussion of the Related Art

In order to protect the circuit components of electronic equipment from potentially damaging electromagnetic radiation, such as an externally-sourced electromagnetic pulse (EMP) or other interference signals such as radar, broadcast radio and television, cellular phone, etc., it is customary to house electronic equipment within some form of electromagnetically shielded enclosure (e.g., a cabinet, a room, a building, etc., collectively referred to herein as an "enclosure"). Once the electronic equipment has been housed, the shielding effectiveness of the enclosure should be verified.

Conventionally, the shielding effectiveness of an enclosure is tested before installing electronic equipment therein. The shielding effectiveness of the enclosure can be tested in a laboratory setting or in the "real world" where the enclosure is deployed for use. Subsequent to testing, it is typically assumed that the shielding effectiveness of the enclosure will remain the same over time. It is, however, not uncommon that the shielding effectiveness of any enclosure will degrade over time. Indeed, there is a government agency "verification " requirement (MIL-STD-188-125) that mandates the ability to test the shielding effectiveness of enclosures after the enclosure has been deployed and after electronic equipment has been housed therein. Such testing can be made very difficult or impossible simply due to the location in which the enclosure is deployed. For example, enclosures are often deployed to remote locations such as Antarctica, deserted islands, jungles, mountain peaks, and other similar locations that are difficult to access and/or are inhospitable to humans as well as to the enclosures themselves. Thus, this strict verification requirement can create many problems that are typically encountered when attempting to conduct on-site testing of the shielding-effectiveness of the enclosure.

The primary purpose of electromagnetic shielding is to substantially reduce exterior incident magnetic and electric fields by several orders of magnitude to protect internal equipment from interference or damage. Likewise, electromagnetic shielding is also used to contain internally generated electric and magnetic fields to prevent exterior equipment from being affected by the fields.

SUMMARY

Several embodiments exemplarily disclosed herein advantageously address the needs above as well as other needs by providing an electromagnetic shielding defect monitoring system and method for using the same.

One embodiment exemplarily described herein is directed to an electromagnetic shielding defect monitoring system that includes a transmit system, a stationary receive system, control circuitry, and analysis circuitry. The transmit system is adapted to transmit a first electromagnetic field toward a first surface of an electromagnetically shielded enclosure, thereby generating a first current on the first surface of the electromagnetically shielded enclosure. The receive system is adapted to detect a second electromagnetic field transmitted from the second surface of the electromagnetically shielded enclosure by a second current induced on the second surface by the first current and to generate a corresponding detected signal. The control circuitry is adapted to control operations of the transmit and receive systems. The analysis circuitry is adapted to identify a location of a defect in the electromagnetically shielded enclosure based upon operations of the transmit and receive systems and based upon the detected signal.

Another embodiment exemplarily described herein is directed to a computer-implemented method of monitoring electromagnetic shielding defects that includes controlling an operation of a transmit system to transmit a first electromagnetic field toward a first surface of an electromagnetically shielded enclosure, thereby generating a first current on the first surface of the electromagnetically shielded enclosure, controlling an operation of a stationary receive system to detect a second electromagnetic field transmitted from the second surface of the electromagnetically shielded enclosure by a second current induced on the second surface by the first current, receiving a detected signal corresponding to the second electromagnetic field, and identifying a location of a defect in the electromagnetically shielded enclosure based upon operations of the transmit and receive systems and upon the detected signal.

Another embodiment exemplarily described herein is directed to a method of monitoring electromagnetic shielding defects that includes transmitting, from at least one of a plurality of sources, a first electromagnetic field toward a first surface of an electromagnetically shielded enclosure, thereby generating a first current on the first surface of the electromagnetically shielded enclosure; selecting at least one of a plurality of stationary receive antennas to detect a second electromagnetic field transmitted from the second surface of the electromagnetically shielded enclosure by a second current induced on the second surface by the first current; generating a detected signal corresponding to the second electromagnetic field; and identifying a location of a defect in the electromagnetically shielded enclosure based upon the generation of the first electromagnetic field, the detection of the second electromagnetic field, and the detected signal.

BRIEF DESCRIPTION OF THE DRAWINGS

The above and other aspects and features of the embodiments exemplarily disclosed herein will be more apparent from the following more particular description thereof, presented in conjunction with the following drawings.

Figure 1:
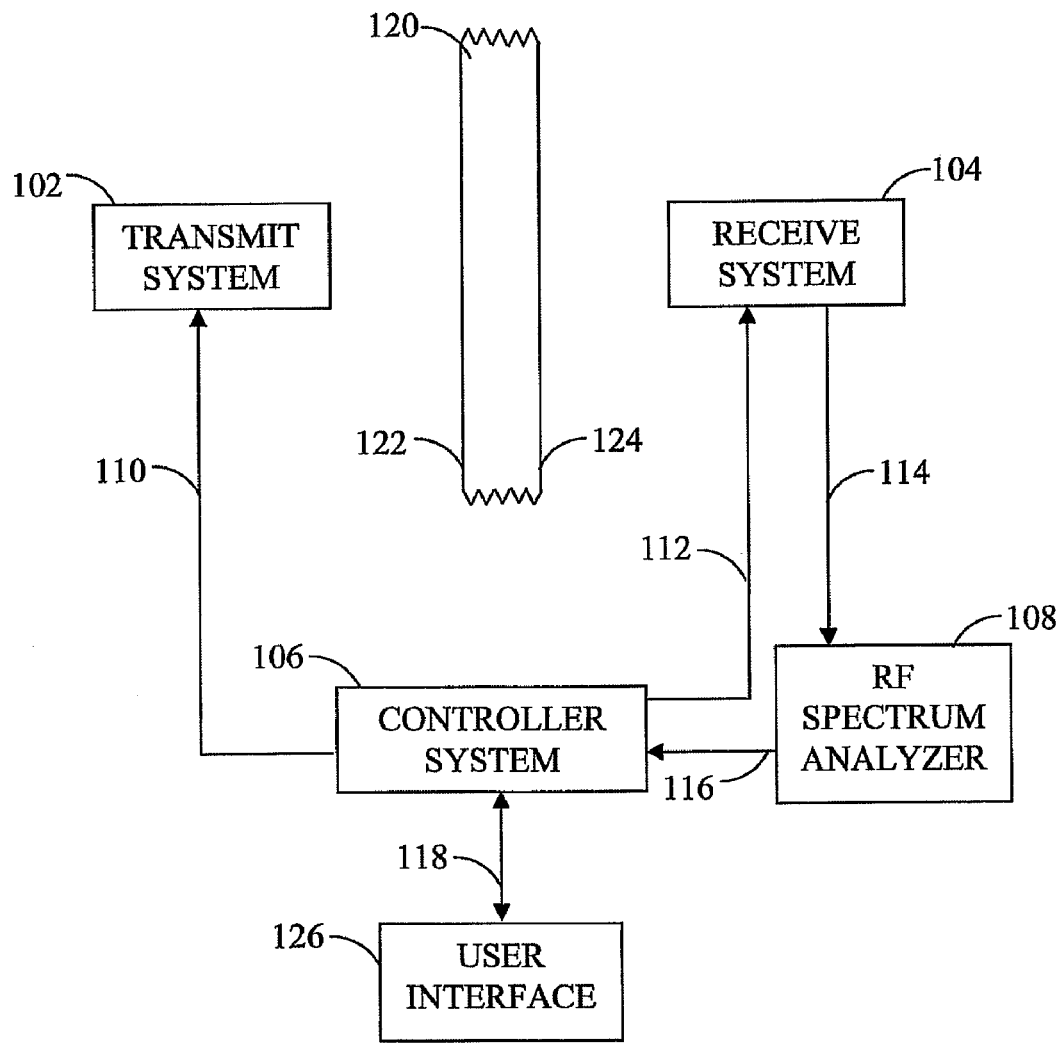
FIG. 1 illustrates one exemplary embodiment of an electromagnetic shielding defect monitoring system.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments exemplarily disclosed herein. Also, common but well-understood elements that are useful or necessary in a commercially feasible embodiment are often not depicted in order to facilitate a less obstructed view of these various embodiments exemplarily disclosed herein.

DETAILED DESCRIPTION

The following description is not to be taken in a limiting sense, but is made merely for the purpose of describing the general principles of exemplary embodiments. The scope of the invention should be determined with reference to the claims.

FIG. 1 illustrates one exemplary embodiment of an electromagnetic shielding defect monitoring system.

As shown in FIG. 1, an exemplary electromagnetic shielding defect monitoring system 100 includes a transmit system 102, a receive system 104, a controller system 106, an RF spectrum analyzer 108, transmit and receive control linkages 110 and 112, respectively, (collectively referred to herein as "control linkages"), detect and analysis output linkages 114 and 116, respectively, (collectively referred to herein as "output linkages"), and a network connection 118. Also shown in FIG. 1 is a partial view of an enclosure 120, having a first surface. 122 and a second surface 124, and a user interface 126.

As generally illustrated in FIG. 1, the transmit system 102 is coupled to the controller system 106 via the transmit control linkage 110, the receive system 104 is coupled to the controller system 106 and the RF spectrum analyzer 108 via the receive control linkage 112 and the detect output linkage 114, respectively. The RF spectrum analyzer 108 is further coupled to the controller system 106 via the analysis output linkage 116. The controller system 106 is coupled to the user interface 126 via the network connection 118.

The enclosure 120 defines a cavity having a low quality or "Q" factor, within which electronic equipment (not shown) such as computers, sensors, etc., may be housed. In one embodiment, the first surface 122 is an exterior surface of the enclosure 120 and the second surface 124 is an interior surface of the enclosure 120. As used herein, the term "exterior surface" generally refers to a set of enclosure surfaces that are exposed to environmental conditions outside the enclosure 120. Similarly, as used herein, the term "interior surface" generally refers to a set of enclosure surfaces that are exposed to environmental conditions inside the enclosure 120. In another embodiment, the first surface 122 is the interior surface of the enclosure 120 and the second surface 124 is the exterior surface of the enclosure 120.

The transmit system 102 is adapted to transmit a first electromagnetic field toward the first surface 122, thereby generating a first current on the first surface 122 of the enclosure 120. A defect in the enclosure 120 (e.g., an aperture in the enclosure 120, a thin area in the enclosure, etc.) electrically couples the first surface 122 with the second surface 124, thereby inducing a second current on the second surface 124. As a result, a second electromagnetic field is transmitted from the second surface 124 based upon the second current. The frequency and amplitude of the second electromagnetic field corresponds to the severity of the defect in the enclosure 120. The second electromagnetic field can be characterized by a radiative region and a quasi-static region.

Figure 2:
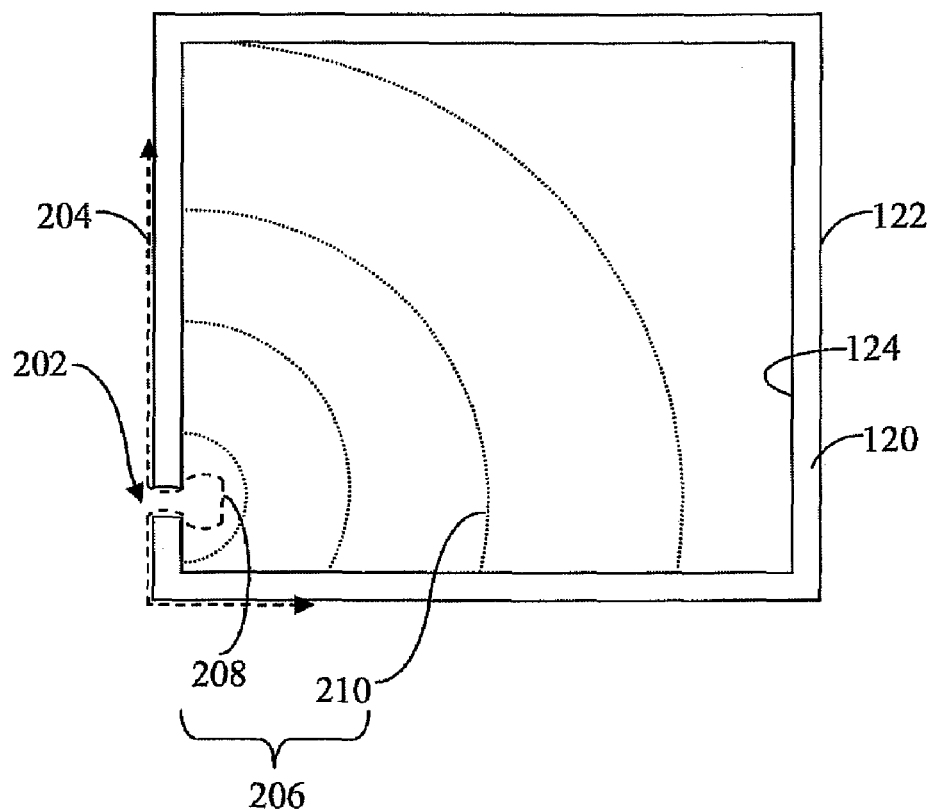
FIG. 2 diagrammatically illustrates quasi-static and radiative regions of an electromagnetic field transmitted from the second surface of an enclosure having a defect.

FIG. 2 diagrammatically illustrates quasi-static and radiative regions of the second electromagnetic field transmitted from the second surface of an enclosure having a defect, according to one embodiment.

Shown in FIG. 2 are a defect 202 in the enclosure 120 (e.g., in an exemplary form of an aperture extending through the first and second surfaces 122 and 124 of the enclosure 120), a first current 204 generated on the first surface 122 of the enclosure 120 by a first electromagnetic field (not shown) transmitted toward the first surface 122 by the transmit system 102 (not shown), and a second electromagnetic field 206 transmitted from the second surface 124 of the enclosure 120 by a second current (not shown) induced on the second surface 124 that is coupled to the first current 204 via defect 202. As illustrated, the second electromagnetic field 206 can be characterized as having a quasi-static region 208 (i.e., represented by the dashed line) and a radiative region 210 (i.e., represented by the square dot isopotential lines). Generally, the field strength of the second electromagnetic field 206 in the quasi-static region 208 decreases rapidly with increasing distance from the defect 202 while the field strength of the second electromagnetic field 206 in the radiative region 210 decreases slowly with increasing distance from the defect 202.

Referring back to FIG. 1, the receive system 104 is adapted to detect the frequency and amplitude of the second electromagnetic field 206 transmitted from the second surface 124 of the enclosure 120. In one embodiment, the receive system 104 is adapted to detect the frequency and amplitude of the second electromagnetic field in both the radiative and quasi-static regions 208 and 210, respectively. Upon detecting the frequency and amplitude of the second electromagnetic field 206, the receive system 104 generates a detected signal that contains detected data (i.e., data representing the detected frequency and amplitude of the radiative and quasi-static regions 208 and 210, respectively, of the second electromagnetic field 206).

The controller system 106 contains control circuitry adapted to control operations of the transmit and receive systems 102 and 104, respectively, during a test procedure in which the presence and/or location of defects within the enclosure 120 is determined. The control circuitry may control operations of the transmit and receive systems 102 and 104, respectively, either automatically or in response to commands received from the user interface 126 via the network connection 118. As used herein, the term "circuitry" refers to any type of computer-executable instructions that can be implemented, for example, as hardware, firmware, and/or software, which are all within the scope of the various teachings described.

As will also be discussed in greater detail below, the controller system 106 further contains analysis circuitry adapted to determine whether a defect in the enclosure 120 exists and identify the location of the defect in the enclosure 120 based upon operations of the transmit and receive systems 102 and 104, respectively, and also based upon the analysis signal generated by the RF spectrum analyzer 108.

The RF spectrum analyzer 108 is adapted to receive the detected signal, analyze the detected data contained therein, and generate an analysis signal based upon analysis of the detected data. Accordingly, the analysis signal may contain quantified detected data representing the frequency and amplitude of the second electromagnetic field in both the radiative and quasi-static regions of the second electromagnetic field. The RF spectrum analyzer 108 may be disposed within the enclosure 120 or outside the enclosure 120. In one embodiment, the RF spectrum analyzer may be provided as any commercially available spectrum analyzer with a resolution bandwidth (RBW) of 10 Hz, capable of being controlled over a LAN, and be sensitive to signals over a range of frequencies between about 10 kHz to about 100 GHz.

The transmit control linkage 110, receive control linkage 112, detect output linkage 114, and analysis output linkage 116 may be provided as one or more fiber optic communication lines, one or more copper lines, or the like, or combinations thereof. In one embodiment, the transmit and receive control linkage 110 and 112, respectively, may comprise a General Purpose Instrumentation Bus (GPIB).

The network connection 118 may be any suitable connection to a network (e.g., a PAN, a LAN, or a WAN), enabling a user to control operations of the electromagnetic shielding defect monitoring system 100 via the controller via the user interface 126.

The user interface 126 may be any device (e.g., a personal computer, a laptop computer, a personal digital assistant, etc.) adapted to communicate with the controller system 106 via the network connection 118.

Although FIG. 1 illustrates the controller system 106 coupled to only one set of transmit and receive systems 102 and 104, respectively, via transmit and receive control linkages 110 and 112, respectively, it will be appreciated that, in other embodiments, the controller system 106 may be coupled to any number of sets of other transmit and receive systems via corresponding transmit and receive control linkages associated with the other sets of transmit and receive systems. Accordingly, the controller system 106 exemplarily disclosed herein may be adapted to control operations of transmit and receive systems associated with multiple enclosures.

Figure 3:
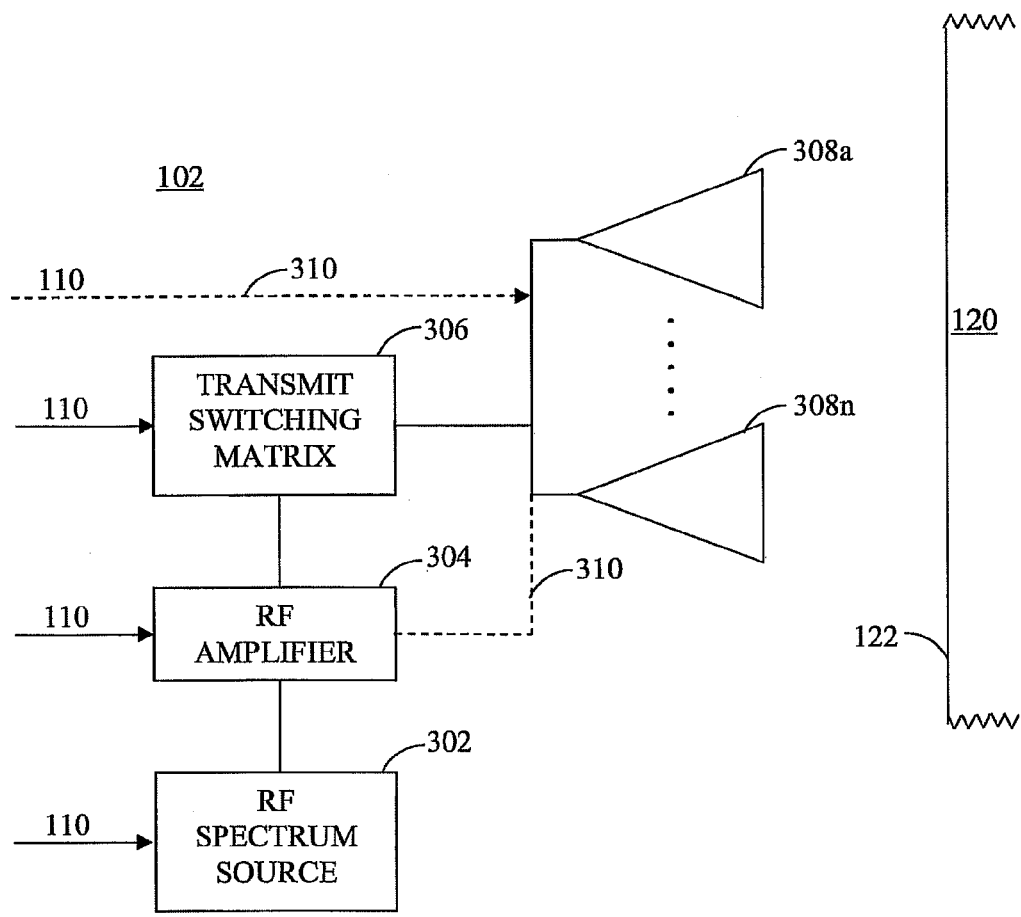
FIG. 3 illustrates one exemplary embodiment of the transmit system shown in FIG. 1.

FIG. 3 illustrates one exemplary embodiment of the transmit system shown in FIG. 1.

As shown in FIG. 3, an exemplary transmit system 102 includes an RF spectrum source 302, an RF amplifier 304, a transmit switching matrix 306, and a plurality of transmit antennas 308a to 308n (generically referred to as transmit antennas 308).

As illustrated, the RF spectrum source 302, the RF amplifier 304, and the transmit switching matrix 306 are each coupled to the transmit control linkage 110. The RF spectrum source 302 is further coupled to the RF amplifier 304, the RF amplifier 304 is further coupled to the transmit switching matrix 306, and the transmit switching matrix 306 is further coupled to the plurality of transmit antennas 308a to 308n.

Although FIG. 3 illustrates the transmit system 102 as comprising, among other elements, the transmit switching matrix 306, it will be appreciated that the transmit system 102 shown in FIG. 3 may alternatively be provided without such a component In such an embodiment, each transmit antenna 308 may be coupled directly to the transmit control linkage 110 and the RF amplifier 304 (e.g., as shown at 310).

As described in various embodiments above, the first surface 122 may be either an exterior or an interior surface of the enclosure 120. Accordingly, where the first surface 122 is an exterior surface, the transmit antennas 308 are disposed outside the enclosure 120. However, where the first surface 122 is an interior surface, the transmit antennas 308 are disposed inside the enclosure 120. In either case, the transmit antennas 308 are permanently installed with respect to the enclosure 120 such that they are positionally fixed relative to the enclosure 120.

The RF spectrum source 302 is adapted to control the frequency of an RF signal (i.e., the first electromagnetic field) transmitted by an activated transmit antenna 308 onto the first surface 122. In one embodiment, the RF spectrum source 302 may be provided as any commercially available spectrum source having an output power ratio of about +15 dBm and adapted to control the frequency of the RF signal (i.e., the first electromagnetic field) transmitted by each transmit antenna 308 to be between about 10 kHz and about 100 GHz.

The RF amplifier 304 is adapted to control the amplitude of the RF signal (i.e., the first electromagnetic field) transmitted by an activated transmit antenna 308 toward the first surface 122 of the enclosure 120. In one embodiment the RF amplifier 304 is comprised of any suitable combination of a commercially available pre-amplifier (not shown) and a commercially available amplifier (not shown) coupled to the pre-amplifier. In such an embodiment, the pre-amplifier may be operable within a frequency range of about 0.01-100 GHz, have a gain of about 25 dB, and have an output power ratio of about +20 dBm and the amplifier may be operable within a frequency range of about 0.01-100 GHz, have a gain of about 30 dB, and have an output power ratio of about +35 dBm.

The transmit switching matrix 306 is adapted to activate at least one of the transmit antennas 308. In one embodiment, the transmit switching matrix 306 comprises a transmit switch control module (not shown), a switch driver (not shown) coupled to the transmit switch control module, and an RF switch array (not shown) coupled to the switch driver. The transmit switch control module receives transmit control signals from the controller system 106 via the transmit control linkage 110 and generates corresponding switch control signals. The switch driver responds to the switch control signals generated by the transmit switch control module by driving the switch array to selectively activate at least one of the transmit antennas 308. In embodiments where the transmit switching matrix 306 is not comprised within the transmit system 102, each transmit antenna 308 within the transmit system 102 remains activated during the entire test procedure.

Any desired number of transmit antennas 308 (e.g., n=1, 2, 3, 4, 5, etc.) may be comprised within the transmit system 102. In one embodiment, the number of transmit antennas 308 comprised within the transmit system 102 may correspond to the number of antennas capable of directly illuminating the total surface area of the first surface 122. Each of the transmit antennas 308 is arranged operably proximate to the first surface 122 of the enclosure 120 (e.g., within about 2 to 3 meters from the first surface 122) and, when activated, is adapted to transmit an RF signal (i.e., a first electromagnetic field) toward the first surface 122 of the enclosure 120.

In one embodiment, each of the transmit antennas 308 may be provided as any commercially available isotropic antenna adapted to transmit RF signals (i.e., electromagnetic fields) over a signal-to-noise range of at least about 100 dB. For example, each transmit antenna 308 may be provided as a 5 dBi antenna with a type N connector.

Figure 4:
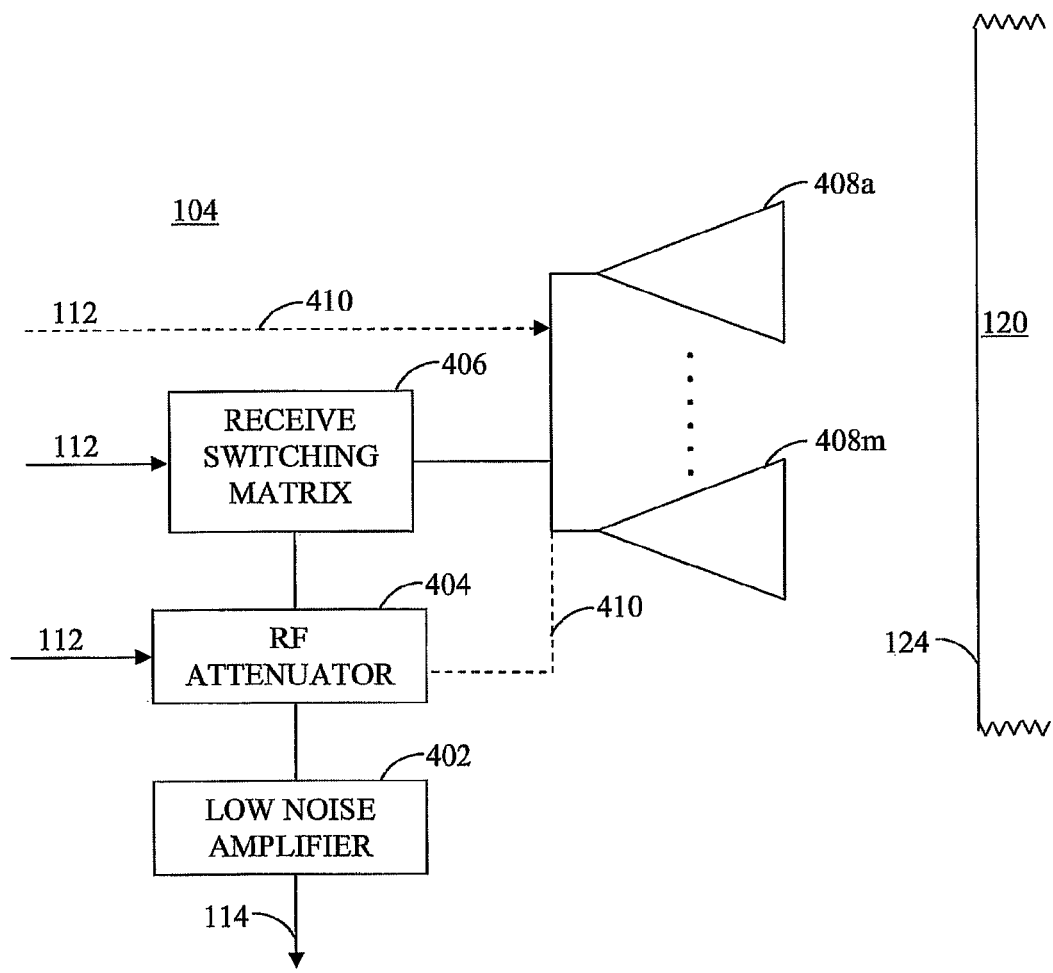
FIG. 4 illustrates one exemplary embodiment of the receive system shown in FIG. 1.

FIG. 4 illustrates one exemplary embodiment of the receive system shown in FIG. 1.

As shown in FIG. 4, an exemplary receive system 104 includes a low noise amplifier 402, an RF attenuator 404, a receive switching matrix 406 and a plurality of receive antennas 408a to 408m (generically referred to as receive antennas 408).

As illustrated, the RF attenuator 404 and the receive switching matrix 406 are each coupled to the receive control linkage 112. The low noise amplifier 402 is coupled to the detect output linkage 114 and to the RF attenuator 404, the RF attenuator 404 is further coupled to the receive switching matrix 406, and the receive switching matrix 406 is further coupled to the plurality of receive antennas 408.

Although FIG. 4 illustrates the receive system 104 as comprising, among other elements, a receive switching matrix 406, it will be appreciated that the receive system 104 shown in FIG. 4 may alternately be provided without such a component. In such an embodiment, each receive antenna 408 may be coupled directly to the receive control linkage 112 and the RF attenuator 404 (e.g., as shown at 410). In view of the above, it will be appreciated that both the transmit and receive systems 102 and 104, respectively, may comprise transmit and receive switching matrices 306 and 406, respectively; only one of the transmit and receive systems 102 and 104, respectively, may comprise a switching matrix; or none of the transmit and receive systems 102 and 104, respectively, may comprise transmit and receive switching matrices 306 and 406, respectively.

As described in various embodiments above, the second surface 124 may be either an interior or an exterior surface of the enclosure 120. Accordingly, where the second surface 124 is an interior surface of the enclosure 120, the receive antennas 408 are disposed inside the enclosure 120. However, where the second surface 124 is an exterior surface of the enclosure 120, the receive antennas 408 are disposed outside the enclosure 120. In either case, the receive antennas 408 are permanently installed with respect to the enclosure 120 such that they are positionally fixed relative to the enclosure 120.

The low noise amplifier 402 is adapted to amplify detected signals generated by activated ones of the plurality of receive antennas 408 and passed by the RF attenuator 404. Detected signals amplified by the low noise amplifier 402 are transmitted to the RF spectrum analyzer 108 via the detect output linkage 114.

The RF attenuator 404 is adapted to reduce the amplitude or power of detected signals generated by activated ones of the plurality of receive antennas 408 without appreciably distorting their waveforms. In one embodiment, the RF attenuator 404 is a programmable attenuator comprising an attenuator control module (not shown), an attenuator driver (not shown) coupled to the attenuator control module, and an adjustable attenuator (not shown) coupled to the attenuator driver. The attenuator control module receives receive control signals from the controller system 106 via the receive control linkage 112 and generates corresponding attenuator control signals. The attenuator driver responds to the attenuator control signals generated by the attenuator control module by driving the adjustable attenuator to selectively adjust the degree to which the detected signal is attenuated. In one embodiment, the RF attenuator 404 may be provided as substantially any suitable attenuator having an attenuation range between about 0 dB to about 70 dB and a frequency range from DC to about 100 GHz.

The receive switching matrix 406 is adapted to activate at least one of the receive antennas 408. In one embodiment, the receive switching matrix 406 comprises a receive switch control module (not shown), a switch driver (not shown) coupled to the switch control module, and an RF switch array (not shown) coupled to the switch driver. The receive switch control module receives receive control signals from the controller system 106 via the receive control linkage 112 and generates corresponding switch control signals. The switch driver responds to the switch control signals generated by the receive switch control module by driving the switch array to selectively activate at least one of the receive antennas 408. In embodiments where the receive switching matrix 406 is not comprised within the receive system 104, each receive antenna 408 within the receive system 104 remains activated during the entire test procedure.

Any desired number of receive antennas 408 (e.g., m=1, 2, 3, 4, 5, etc.) may be comprised within the receive system 104. In one embodiment, the number of receive antennas 408 in the receive system 104 exceeds the number of transmit antennas 308 in the transmit system 102 (i.e., m>n). In another embodiment, the number of transmit antennas 308 in the transmit system 102 exceeds the number of receive antennas 408 in the receive system 104 (i.e., n>m). In one embodiment, the number of receive antennas 408 comprised within the receive system 104 may be enough to cover correspond to the total surface area of the second surface 124. Each of the receive antennas 408 is arranged operably proximate to the second surface 124 of the enclosure 120 (e.g., within about 1 to 2 meters from the second surface 124) and, when activated, is adapted to receive an RF signal (i.e., a second electromagnetic field) transmitted from the second surface 124 and to detect the second electromagnetic field induced on the second surface 124 of the enclosure 120. Each of the receive antennas 408 is arranged operably proximate to the second surface 124 of the enclosure 120 and, when activated, are adapted to detect the frequency and amplitude of the second electromagnetic field 206 in both the aforementioned radiative and quasi-static regions 208 and 210, respectively, and generate a detected signal corresponding to the frequency and amplitude detected.

In one embodiment, each of the receive antennas 406 may be provided as any commercially available isotropic antenna adapted to receive RF signals (i.e., electromagnetic fields).

Figure 5:
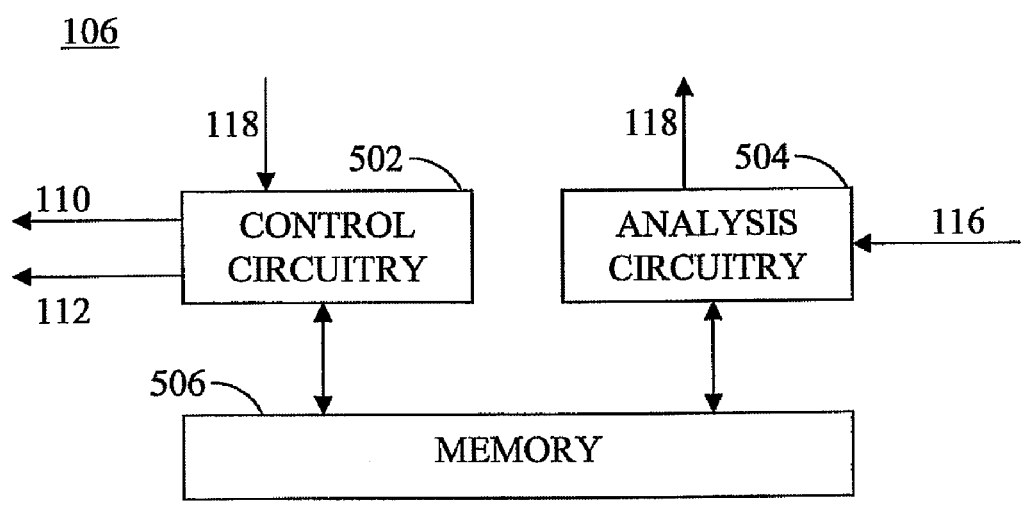
FIG. 5 illustrates an exemplary functional block diagram of the controller system shown in FIG. 1, according to one embodiment.

FIG. 5 illustrates an exemplary functional block diagram of the controller system 106 shown in FIG. 1, according to one embodiment.

As shown in FIG. 5, the controller system 106 includes the aforementioned control circuitry 502, the aforementioned analysis circuitry 504, in addition to memory 506. Also shown in FIG. 5 are the aforementioned transmit and receive control linkages 110 and 112, respectively, the analysis output linkage 116, and the network connection 118.

The control circuitry 502 is coupled to the transmit and receive control linkages 110 and 112, respectively, the network connection 118, and the memory 506. The analysis circuitry 504 is further coupled to the analysis output linkage 116, the network connection 118, and the memory 506. As used herein, the term "memory" is intended to refer to any computer-readable storage medium and/or device such as read access memory (RAM), read only memory (ROM), a hard disk drive, optical disk/optical disk drive, magnetic disk/magnetic disk drive, and the like, and combinations thereof.

As discussed above, the control circuitry 502 is adapted to control operations of the transmit system 102 and the receive system 104 during a test procedure. Accordingly, and in one embodiment, the control circuitry 502 is adapted to control operations of the transmit system 102 exemplarily described with respect to FIG. 3 by driving the RF spectrum source 302 to cause an activated transmit antenna 308 to direct an RF signal (i.e., a first electromagnetic field) of a particular frequency toward the first surface 122, driving the RF amplifier 304 to cause an activated transmit antenna 308 to direct an RF signal (i.e., a first electromagnetic field) having a particular amplitude, and driving the transmit switching matrix 306 to activate one or more particular transmit antennas 308. In embodiments where the transmit system 102 does not comprise the transmit switching matrix 306, transmit antennas 308 are simply activated when the RF spectrum source 302 and RF amplifier 304 are driven.

In one embodiment, the control circuitry 502 may drive the RF spectrum source 302, the RF amplifier 304, and the transmit switching matrix 306 (when comprised within the transmit system 102) as described above by generating various transmit control signals and communicating the transmit control signals to the RF spectrum source 302, the RF amplifier 304, and the transmit switching matrix 306, via the transmit control linkage 110.

For example, the control circuitry 502 may be adapted to drive the RF spectrum source 302 to control the frequency of the RF signal (i.e., the first electromagnetic field) transmitted by an activated transmit antenna 308 to be at least a minimum frequency, $F_o$. In one embodiment, the minimum frequency, $F_o$ may correspond to physical dimensions of the enclosure 120, to shielding requirements of the enclosure 120, or the like, or combinations thereof. For example, the minimum frequency $F_o$ may be determined according to the formula:

$F_o=300/4L$, where L is the maximum dimension of the enclosure 120 in x, y, or z Cartesian coordinates. In such an embodiment, the value for L may be input by the user (e.g., via the user interface 126).

In another embodiment, the control circuitry 502 is adapted to drive the RF spectrum source 302 to vary the frequency of the RF signal (i.e., the first electromagnetic field) transmitted by an activated transmit antenna 308. In such an embodiment, the control circuitry 502 may drive the RF spectrum source 302 to vary the frequency of the RF signal (i.e., the first electromagnetic field) transmitted by an activated transmit antenna 308 at a plurality of frequency points having frequencies ranging from $F_o$ (or 10 kHz, whichever is greater) to about 100 GHz, with a dwell time for each frequency point of about 9 seconds or less. Further, the total number of frequency points used is variable and depends upon the step size between successive frequency points. For example, the step size between successive frequency points may be about 5% or less of the absolute frequency. In one embodiment, the controller system 106 may be adapted to drive the RF spectrum source 302 to vary the frequency of the RF signal (i.e., the first electromagnetic field) transmitted by an activated transmit antenna 308 with frequency points at a predetermined step size. In another embodiment, the step size between successive frequency points may be input/modified by the user (e.g., via the user interface 126). The amount of time required to transmit an RF signal (i.e., a first electromagnetic field), having the plurality of frequencies as described above, at the first surface 122 may be referred to herein as a "test period."

In one embodiment, the control circuitry 502 is adapted to drive the transmit switching matrix 306 to sequentially activate one or more transmit antennas 308. In such an embodiment, the control circuitry 502 may drive the transmit switching matrix 306 to activate one or more transmit antennas 308 for a duration sufficient to allow the activated transmit antenna(s) to transmit RF signals (i.e., first electromagnetic fields) at the plurality of frequency points having frequencies ranging from $F_o$ (or 10 kHz, whichever is greater) to about 100 GHz.

In one embodiment, the control circuitry 502 generates the aforementioned transmit control signals upon being instructed to do so by commands generated at the user interface and communicated to the controller system 106 via the network connection 118. In another embodiment, the control circuitry 502 generates the aforementioned transmit control signals automatically according to, for example, a predetermined schedule stored in memory 506.

As discussed above, the control circuitry 502 is adapted to control operations of the receive system 104 during a test procedure. Accordingly, and in one embodiment, control circuitry 502 is adapted to control operations of the receive system 104 exemplarily described with respect to FIG. 3 by driving the receive switching matrix 406 to activate one or more particular receive antennas 408, driving the RF attenuator 404 to adjust the attenuation settings thereof, and driving the receive switching matrix 406 to activate one or more particular receive antennas 408. In embodiments where the receive system 104 does not comprise the receive switching matrix 406, receive antennas 408 are simply activated when the RF spectrum source 302 and RF amplifier 304 are driven.

In one embodiment, the control circuitry 502 may drive the RF attenuator 404 and the receive switching matrix 406 (when included within the receive system 104) by generating a receive control signal and communicating the receive control signal to the receive switching matrix 406 and RF attenuator 404, via the receive control linkage 112.

For example, the control circuitry 502 is adapted to drive the receive switching matrix 406 to sequentially activate a receive antenna 308 when one or more transmit antennas 308 are activated. In such an embodiment, the control circuitry 502 may drive the receive switching matrix 406 to activate one receive antenna 408 for a duration equal to one test period associated with one or more activated transmit antennas 306. In another embodiment, the control circuitry 502 may drive the receive switching matrix 406 to activate one receive antenna 408 for a duration equal to test periods associated with sequentially activated transmit antennas 306 comprised within the transmit system 102.

In one embodiment, the control circuitry 502 generates the aforementioned receive control signals upon being instructed to do so by commands generated at the user interface and communicated to the controller system 106 via the network connection 118. In another embodiment, the control circuitry 502 generates the aforementioned receive control signals automatically according to, for example, a predetermined schedule stored in memory 506.

As described above, the analysis circuitry 504 is adapted determine whether a defect in the enclosure 120 exists and identify the location of the defect in the enclosure 120.

In one embodiment, the analysis circuitry 504 is adapted to determine the general location of the defect within the enclosure 120 based, at least in part, upon the field strength of the radiative region 210 of the second electromagnetic field 206 as detected by an activated receive antenna 408. Assuming that an activated receive antenna 408 detects an electromagnetic field having a strength that is proportional to antenna voltage, the shielding effectiveness, SE, of the enclosure 120 can be determined according to Equation 1:

$$SE = 20\log\left(\frac{V_c}{V_t}\right), \qquad \text{Eq. (1)}$$

where $V_t$ represents the signal strength of an analysis signal generated during a test procedure in which an RF signal (i.e., a first electromagnetic field) having a predetermined frequency and polarization is transmitted by a transmit antenna 308 toward the enclosure 120 and where $V_c$ represents the signal strength of an analysis signal generated during a calibration procedure in which an RF signal (i.e., a first electromagnetic field) having the predetermined frequency and polarization was transmitted by a transmit antenna 308 directly to the receive antenna 408. Corrections may be applied for any differences in instrumentation system, gain, or attenuation between the calibration and test procedures.

Accordingly, during a test procedure; the analysis circuitry 504 receives data indicating the signal strength $V_t$ of the analysis signal from the RF spectrum analyzer 108 via the analysis output linkage 116, calculates an SE value using the signal strength $V_t$ and the predetermined calibration value $V_c$. The calculated SE of the enclosure during the test procedure is then compared with a preset threshold SE value. If results of the comparing indicate that the preset threshold shield effectiveness value is less than the determined shield effectiveness, SE, it is inferred that a defect exists within the enclosure 120. Subsequently, the analysis circuitry 504 determines the location of the defect in the enclosure 120.

In one embodiment, the analysis circuitry 504 is adapted to determine the precise location of the defect within the enclosure 120 based, at least in part, upon the field strength of the radiative region 210 of the second electromagnetic field 206 as detected by an activated receive antenna 408. The precision to which the location of a defect is determined (i.e., the quasi-static detection limit) can be increased by increasing the frequency of the RF signal (i.e., the first electromagnetic field) transmitted by an activated transmit antenna 308, and thus the frequency of the second electromagnetic field 206, as shown by the experimentally obtained values presented in Table 1 below:

TABLE 1

| Frequency of RF Signal (Hz) | Wavelength of RF Signal (m) | Quasi-Static Detection Limit (m) | Quasi-Static Detection Limit (in) |
|---|---|---|---|
| $4.25 \times 10^8$ | $7.06 \times 10^{-1}$ | 0.11 | 4.42 |
| $5.25 \times 10^8$ | $5.71 \times 10^{-1}$ | 0.09 | 3.58 |
| $7.25 \times 10^8$ | $4.14 \times 10^{-1}$ | 0.07 | 2.59 |
| $9.25 \times 10^8$ | $3.24 \times 10^{-1}$ | 0.05 | 2.03 |

In one embodiment, the analysis circuitry 504 identifies the precise location of the defect using operational variables of the transmit and receive systems 102 and 104, respectively, and analysis signals generated during the test procedure, as inputs of a triangulation procedure.

For example, the control circuitry 502 outputs transmit and receive control signals adapted to drive the transmit and receive systems 102 and 104, respectively, to activate one or more transmit antennas 308 in synchrony with one or more receive antennas 408 until a desired number of combinations or types of combinations of activated transmit/receive antennas 308/408 has been obtained. Data identifying each activated transmit and receive antenna 308 and 408, respectively, (i.e., transmit antenna selection data and receive antenna selection data, respectively) is stored within memory 506. Additionally, the control circuitry 502 outputs transmit control signals adapted to drive the RF spectrum source 302 and the RF amplifier 304 to cause the RF signals (i.e., the first electromagnetic fields) transmitted directed by the transmit antennas to have a particular frequency and amplitude. Data representing the frequency and amplitude of each RF signal (i.e., first electromagnetic field) transmitted by each activated transmit antenna 308 (i.e., transmit frequency data and transmit amplitude data, respectively) is also stored within memory 506 and is correlated with transmit antenna selection and receive antenna selection data. An analysis signal is generated by the RF spectrum analyzer 108 for each combination of activated transmit/receive antennas 308/408 and is communicated to the analysis circuitry 504. Quantified detected data within the analysis signal representing the frequency and amplitude of the quasi-static region or the radiative region of the second electromagnetic field is then stored within the memory 506 and correlated with the transmit antenna selection data, receive antenna selection data, transmit frequency data, and transmit amplitude data. After operations of the transmit and receive systems 102 and 104 have been controlled as desired, the analysis circuitry 504 accesses the memory 506 and identifies the location of the defect in the enclosure 120 according to any suitable triangulation method.

Figure 6:
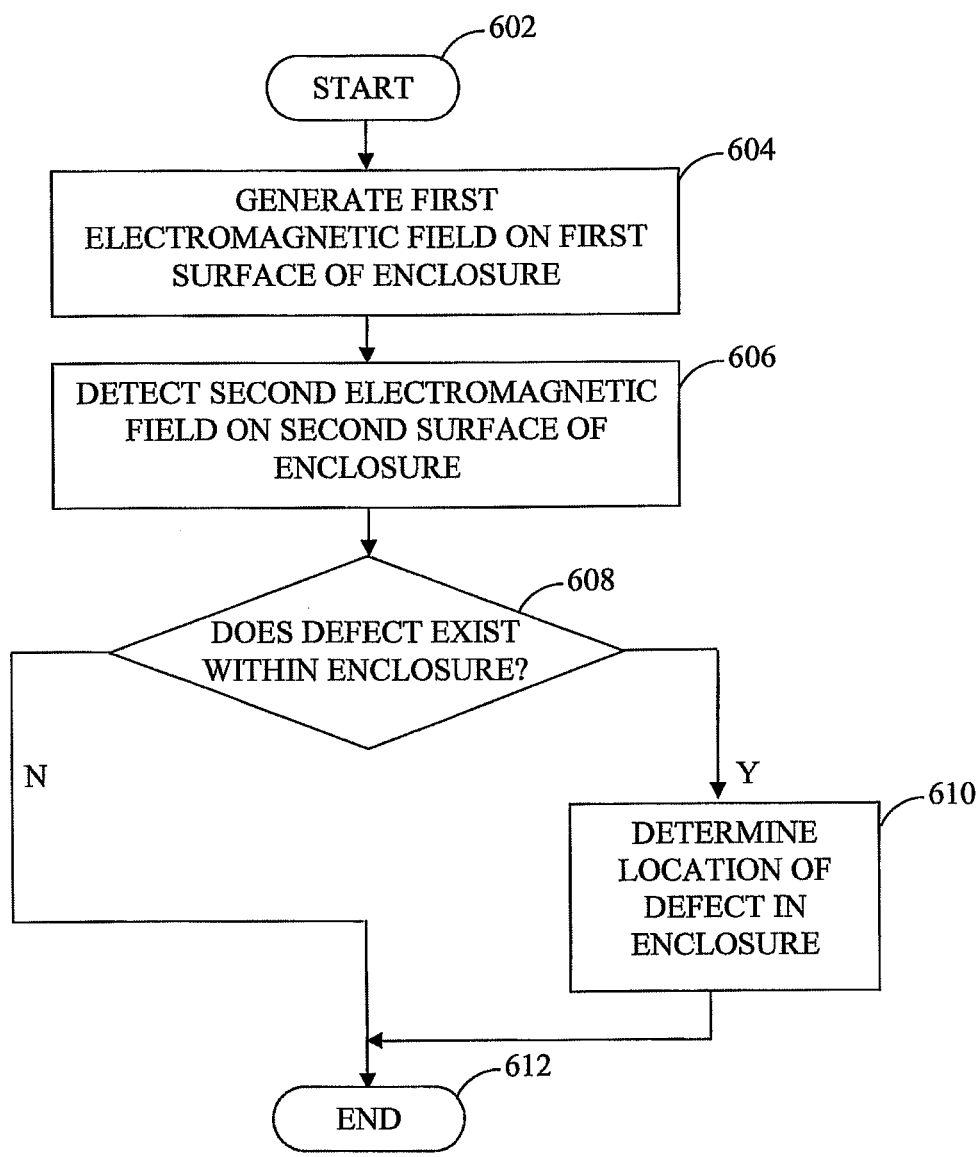
FIG. 6 exemplarily describes one embodiment of a method for monitoring electromagnetic shielding defects.

FIG. 6 exemplarily describes one embodiment of a method for monitoring electromagnetic shielding defects according to the aforementioned test procedure.

The illustrated test procedure begins at 602. At 604, a first electromagnetic field is transmitted toward the first surface 122 of the enclosure 120. As described above, the first electromagnetic field may be generated upon the controller system 106 outputting transmit control signals to control operations of the various components of the transmit system 102 via the transmit control linkage 110.

At 606, a second electromagnetic field transmitted from the second surface 124 of the enclosure 120 is detected. As described above, the second electromagnetic field may be detected upon the controller system 106 outputting receive control signals to control operations of the various components of the receive system 104 via the receive control linkage 112. Detected signals, corresponding to the detected second electromagnetic field, are output by the receive system 104 to the RF spectrum analyzer 108 via the detect output linkage 114. Analysis signals, corresponding to the detected signals, are output by the RF spectrum analyzer 108 to the controller system 106 via the analysis output linkage 116.

At 608, it is determined whether a defect exists within the enclosure 120. As described above, the analysis circuitry 504 is adapted to determine whether a defect exists within the enclosure 120 by comparing the analysis signal output by the RF spectrum analyzer 108 with a predetermined calibration value.

If it is determined that a defect does exist then, at 610, the location of the defected within the enclosure 120 is determined. In one embodiment, a defect detection alarm signal may be communicated from the controller system 106 to the user interface 126 via the network connection 118 upon determining that a defect exists within the enclosure 120. The defect detection alarm signal may cause the user interface 126 to alert a user of the user interface 126 to the fact that a defect has been detected within the enclosure 120. As described above, the location of a defect is determined by employing a triangulation procedure using operational variables of the transmit and receive systems 102 and 104, respectively, and analysis signals output by the RF spectrum analyzer 108, as inputs of a triangulation procedure. In one embodiment, a defect location signal may be communicated from the controller system 106 to the user interface 126 via the network connection 118 upon determining the location of the defect within the enclosure 120. The defect location signal may cause the user interface 126 to identify the location of the defect within the enclosure 120 to a user of the user interface 126. Subsequently, or if it is determined that a defect does not exist then, at 612, the test procedure ends.

In one embodiment, data generated during a test procedure may be archived within memory 506 for record-keeping purposes. In another embodiment, data generated during a test procedure may be communicated to the user interface 126 via the network connection 118 during or after completion of the test procedure. Data generated during a test procedure may be communicated to the user interface 126, for example, in the form of a plot of SE values derived from activated receive antennas 408 versus frequency of RF signal directed by activated transmit antennas 308.

Numerous embodiments have been exemplarily described above that provide an electromagnetic shielding defect monitoring system adapted to detect shielding faults correlatable to, for example, MIL-STD-188-125 shielding performance requirements, trigger detection alarm signals if necessary, and provide a capability to precisely locate the shielding fault so that corrective maintenance can be applied.

While the numerous embodiments have been exemplarily described by means of specific examples and applications thereof, numerous modifications and variations could be made thereto by those skilled in the art without departing from the scope of the invention set forth in the claims.

What is claimed is:

1. An electromagnetic shielding defect monitoring system, comprising:
    a transmit system adapted to transmit a first electromagnetic field toward a first surface of an electromagnetically shielded enclosure, thereby generating a first current on the first surface;
    a stationary receive system adapted to detect a second electromagnetic field transmitted from a second surface of the electromagnetically shielded enclosure by a second current induced on the second surface by the first current and to generate a corresponding detected signal;
    control circuitry adapted to control operations of the transmit and receive systems; and
    analysis circuitry adapted to identify a location of a defect in the electromagnetically shielded enclosure based upon operations of the transmit and receive systems and based upon the detected signal.

2. The electromagnetic shielding defect monitoring system of claim 1, wherein the first surface is an exterior surface of the electromagnetically shielded enclosure and the second surface is an interior surface of the electromagnetically shielded enclosure.

3. The electromagnetic shielding defect monitoring system of claim 1, wherein the first surface is an interior surface of the electromagnetically shielded enclosure and the second surface is an exterior surface of the electromagnetically shielded enclosure.

4. The electromagnetic shielding defect monitoring system of claim 1, wherein the transmit system comprises:
    a transmit antenna operably proximate to the first surface of the electromagnetically shielded enclosure and adapted to transmit the first electromagnetic field toward the first surface of the electromagnetically shielded enclosure;
    an amplifier adapted to control an amplitude of the first electromagnetic field transmitted by the transmit antenna; and
    a spectrum source adapted to control a frequency of the first electromagnetic field transmitted by the transmit antenna.

5. The electromagnetic shielding defect monitoring system of claim 4, wherein the control circuitry is adapted to control an operation of the transmit system by controlling at least one of the amplifier and spectrum source to control at least one of the amplitude and frequency of the first electromagnetic field transmitted by the transmit antenna.

6. The electromagnetic shielding defect monitoring system of claim 1, wherein the transmit system further comprises:
    a plurality of transmit antennas each operably proximate to the first surface of the electromagnetically shielded enclosure and adapted to transmit the first electromagnetic field toward the first surface of the electromagnetically shielded enclosure; and
    a transmit switching matrix adapted to activate at least one of the plurality of transmit antennas to transmit the first electromagnetic field.

7. The electromagnetic shielding defect monitoring system of claim 6, wherein the control circuitry is adapted to control an operation of the transmit system by controlling which of the plurality of transmit antennas are activated by the transmit switching matrix.

8. The electromagnetic shielding defect monitoring system of claim 1, wherein the receive system comprises:
    a receive antenna operably proximate to the second surface of the electromagnetically shielded enclosure and adapted to detect the second electromagnetic field; and
    a spectrum analyzer adapted to generate the detected signal based on the second electromagnetic field detected by the receive antenna.

9. The electromagnetic shielding defect monitoring system of claim 1, wherein the receive system comprises:
    a plurality of receive antennas each operably proximate to the second surface of the electromagnetically shielded enclosure and adapted to detect the second electromagnetic field; and
    a receive switching matrix adapted to activate at least one of the receive antennas to detect the second electromagnetic field.

10. The electromagnetic shielding defect monitoring system of claim 9, wherein the control circuitry is adapted to control an operation of the receive system by selectively coupling a receive antenna to the spectrum analyzer via the receive switching matrix.

11. The electromagnetic shielding defect monitoring system of claim 1, wherein:
    the transmit and receive systems are locally or remotely coupled to the control circuitry; and
    the receive system is locally or remotely coupled to the analysis circuitry.

12. A computer-implemented method of monitoring electromagnetic shielding defects, comprising:
    controlling an operation of a transmit system to transmit a first electromagnetic field toward a first surface of an electromagnetically shielded enclosure, thereby generating a first current on the first surface;
    controlling an operation of a stationary receive system to detect a second electromagnetic field transmitted from a second surface of the electromagnetically shielded enclosure by a second current induced on the second surface by the first current;
    receiving a detected signal corresponding to the second electromagnetic field; and
    identifying a location of a defect in the electromagnetically shielded enclosure based upon operations of the transmit and receive systems and upon the detected signal.

13. The computer-implemented method of monitoring electromagnetic shielding defects of claim 12, wherein the first surface is an exterior surface of the electromagnetically shielded enclosure and the second surface is an interior surface of the electromagnetically shielded enclosure.

14. The computer-implemented method of monitoring electromagnetic shielding defects of claim 12, wherein the first surface is an interior surface of the electromagnetically shielded enclosure and the second surface is an exterior surface of the electromagnetically shielded enclosure.

15. The computer-implemented method of monitoring electromagnetic shielding defects of claim 12, wherein controlling the operation of the transmit system comprises controlling at least one of a frequency and an amplitude of the first electromagnetic field toward the first surface of the electromagnetically shielded enclosure by a transmit antenna comprised within the transmit system.

16. The computer-implemented method of monitoring electromagnetic shielding defects of claim 12, wherein controlling the operation of the transmit system comprises controlling which of a plurality of transmit antennas comprised within the transmit system to activate to transmit the first electromagnetic field toward the first surface of the electromagnetically shielded enclosure.

17. The computer-implemented method of monitoring electromagnetic shielding defects of claim 12, wherein controlling the operation of the receive system comprises selecting which of a plurality of receive antennas comprised within the receive system to detect the second electromagnetic field.

18. The computer-implemented method of monitoring electromagnetic shielding defects of claim 12, further comprising:

locally or remotely controlling the transmit and receive systems; and locally or remotely identifying the location of the defect in the electromagnetically shielded enclosure.

19. A method of monitoring electromagnetic shielding defects, comprising:

transmitting, from at least one of a plurality of sources, a first electromagnetic field toward a first surface of an electromagnetically shielded enclosure, thereby generating a first current on the first surface;

selecting at least one of a plurality of stationary receive antennas to detect a second electromagnetic field transmitted from a second surface of the electromagnetically shielded enclosure by a second current induced on the second surface by the first current;

generating a detected signal corresponding to the second electromagnetic field; and identifying a location of a defect in the electromagnetically shielded enclosure based upon the generation of the first electromagnetic field, the detection of the second electromagnetic field, and the detected signal.

\* \* \* \* \*

(12) INTER PARTES REEXAMINATION CERTIFICATE (1021st)
United States Patent
Crain et al.

(10) Number: US 7,459,916 C1
(45) Certificate Issued: Dec. 31, 2014

(54) ELECTROMAGNETIC SHIELDING DEFECT MONITORING SYSTEM AND METHOD FOR USING THE SAME

(75) Inventors: Charles R. Crain, Colorado Springs, CO (US); Phillip D. Lane, Colorado Springs, CO (US); Kelly L. Rice, Colorado Springs, CO (US); James A. Youngman, Woodland Park, CO (US)

(73) Assignee: L-3 Communications Corporation, New York, NY (US)

Reexamination Request:
No. 95/000,656, Jan. 23, 2012

Reexamination Certificate for:
Patent No.: 7,459,916
Issued: Dec. 2, 2008
Appl. No.: 11/468,755
Filed: Aug. 30, 2006

(51) Int. Cl.
*G01R 27/28* (2006.01)
*G01N 27/82* (2006.01)

(52) U.S. Cl.
USPC .......................................... 324/627; 324/240

(58) Field of Classification Search
None
See application file for complete search history.

(56) References Cited

To view the complete listing of prior art documents cited during the proceeding for Reexamination Control Number 95/000,656, please refer to the USPTO's public Patent Application Information Retrieval (PAIR) system under the Display References tab.

*Primary Examiner* — James Menefee

(57) ABSTRACT

An embodiment disclosed herein is directed to an electromagnetic shielding defect monitoring system that includes a transmit system adapted to transmit a first electromagnetic field toward a first surface of an electromagnetically shielded enclosure, thereby generating a first current on the first surface, a stationary receive system adapted to detect a second electromagnetic field transmitted from a second surface of the electromagnetically shielded enclosure by a second current induced on the second surface by the first current and to generate a corresponding detected signal; control circuitry adapted to control operations of the transmit and receive systems; and analysis circuitry adapted to identify a location of a defect in the electromagnetically shielded enclosure based upon operations of the transmit and receive systems and based upon the detected signal.

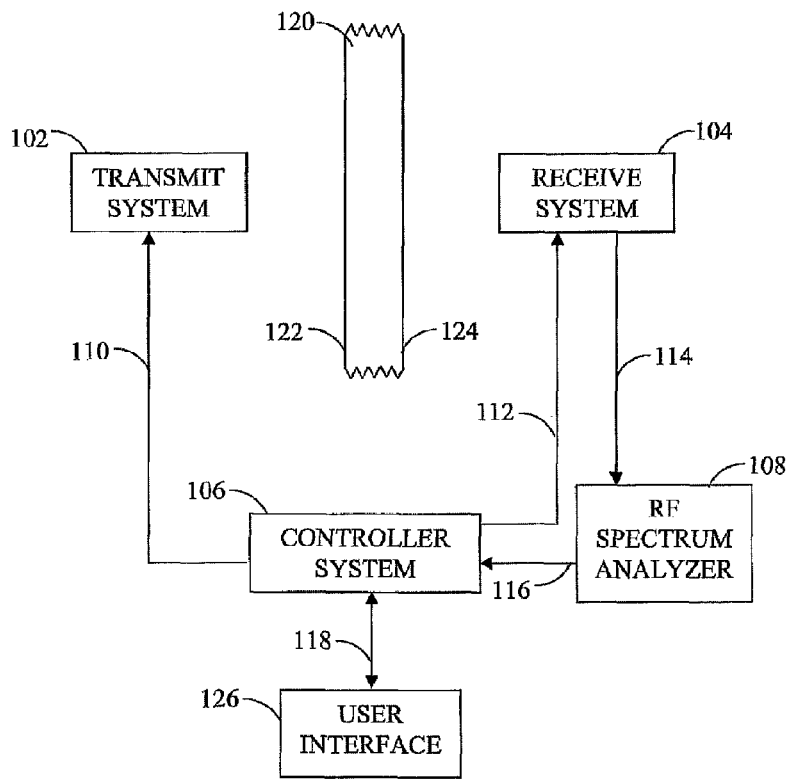

1

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-5, 9, 11-15, 17 and 18 is confirmed.

New claims 20-43 are added and determined to be patentable.

Claims 6-8, 10, 16 and 19 were not reexamined.

20. *The electromagnetic shielding defect monitoring system of claim 1 wherein the detected signal is detected by one or more stationary antennas.*

21. *The electromagnetic shielding defect monitoring system of claim 1 wherein the analysis circuitry is adaptive and can automatically determine the location of the defect using a triangulation method of a combination of radiated and quasi-static field strengths.*

22. *The electromagnetic shielding defect monitoring system of claim 1 wherein the analysis circuitry uses and controls operational variables of the transmit and receive systems and analysis signals generated during a test procedure as inputs of a triangulation method for determining the location of the defect.*

23. *The electromagnetic shielding defect monitoring system of claim 1 wherein the control circuitry is further adapted to provide a defect location signal to a local or remote user interface which causes the user interface to indicate the location of the defect within the enclosure.*

24. *The electromagnetic shielding defect monitoring system of claim 1 wherein the control circuitry and the analysis circuitry are adapted to perform a calibration procedure to produce a calibration value.*

25. *The electromagnetic shielding defect monitoring system of claim 24 wherein a shielding effectiveness measurement is determined based on the detected signal and the calibration value.*

26. *The electromagnetic shielding defect monitoring system of claim 1 wherein the stationary receive system comprises a plurality of isotropic antennas.*

27. *The electromagnetic shielding defect monitoring system of claim 1, wherein the transmit system is remotely coupled to the control circuitry.*

28. *The electromagnetic shielding defect monitoring system of claim 1, wherein the receive system is remotely coupled to the control circuitry.*

29. *The electromagnetic shielding defect monitoring system of claim 1 wherein the receive system is remotely coupled to the analysis circuitry.*

30. *The electromagnetic shielding defect monitoring system of claim 1, wherein the receive system is remotely coupled to the analysis circuitry.*

31. *The electromagnetic shielding defect monitoring system of claim 1, wherein the stationary receive system comprises one or more antennas that are stationary while detecting of the detected signal used to identify the location of the defect.*

32. *The method of claim 12 wherein the detected signal is detected by one or more stationary antennas.*

33. *The method of claim 12 wherein the identifying the location of the defect step further comprises automatically determining the location of the defect using a triangulation method of a combination of radiated and quasi-static field strengths.*

34. *The method of claim 12 wherein operational variables of the transmit and receive systems and analysis signals generated during a test procedure are used as inputs of a triangulation method used to determine the location of the defect.*

35. *The method of claim 12 further comprising providing a defect location signal to a local or remote user interface which causes the user interface to indicate the location of the defect within the enclosure.*

36. *The electromagnetic shielding defect monitoring system of claim 12 further comprising controlling the transmit system and the stationary receive system to perform a calibration procedure to produce a predetermined calibration value.*

37. *The electromagnetic shielding defect monitoring system of claim 36 wherein a shielding effectiveness measurement is determined based on the detected signal and the predetermined calibration value.*

38. *The method of claim 12 wherein the detected signal is detected by one or more isotropic antennas.*

39. *The computer-implemented method of monitoring electromagnetic shielding defects of claim 12, further comprising: remotely controlling the transmit system.*

40. *The computer-implemented method of monitoring electromagnetic shielding defects of claim 12, further comprising: remotely controlling the receive system.*

41. *The computer-implemented method of monitoring electromagnetic shielding defects of claim 12, further comprising: remotely identifying the location of the defect in the electromagnetically shielded enclosure.*

42. *The computer-implemented method of monitoring electromagnetic 12, wherein the stationary receive system comprises one or more antennas that are stationary while detecting of the detected signal used to identify the location of the defect.*

43. *An electromagnetic shielding defect monitoring system comprising:*
   *a transmit system configured to transmit a first electromagnetic field toward a first surface of an electromagnetically shielded enclosure, thereby generating a first current on the first surface;*
   *a stationary receive system configured to detect a second electromagnetic field transmitted from a second surface of the electromagnetically shielded enclosure by a second current induced on the second surface by the first current and to generate a corresponding detected signal;*
   *control circuitry configured to control operations of the transmit and receive systems; and*
   *analysis circuitry configured to identify a location of a defect in the electromagnetically shielded enclosure based upon operations of the transmit and receive systems and based upon the detected signal*
   *wherein the transmit system and the stationary receive system are configured to be remotely controlled by control circuitry.*

\* \* \* \* \*